(12) United States Patent
Furuya et al.

(10) Patent No.: US 11,948,859 B2
(45) Date of Patent: Apr. 2, 2024

(54) ELEMENT MODULE

(71) Applicant: TOSHIBA MITSUBISHI-ELECTRIC INDUSTRIAL SYSTEMS CORPORATION, Chuo-ku (JP)

(72) Inventors: Takayuki Furuya, Tokyo (JP); Akira Kagami, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 453 days.

(21) Appl. No.: 17/424,695

(22) PCT Filed: Dec. 5, 2019

(86) PCT No.: PCT/JP2019/047562
§ 371 (c)(1),
(2) Date: Jul. 21, 2021

(87) PCT Pub. No.: WO2021/111575
PCT Pub. Date: Jun. 10, 2021

(65) Prior Publication Data
US 2022/0102243 A1  Mar. 31, 2022

(51) Int. Cl.
*H01L 23/473* (2006.01)
*H01L 23/492* (2006.01)
*H01L 25/07* (2006.01)

(52) U.S. Cl.
CPC ........ *H01L 23/473* (2013.01); *H01L 23/4922* (2013.01); *H01L 25/071* (2013.01)

(58) Field of Classification Search
CPC .................................................. H01L 23/473
See application file for complete search history.

(56) References Cited

U.S. PATENT DOCUMENTS

2017/0301662 A1* 10/2017 Kimura ............ H01L 23/49548
2019/0122958 A1*  4/2019 Uneme ............. H05K 7/20927

FOREIGN PATENT DOCUMENTS

JP  2000-269393 A  9/2000
JP  2003-258175 A  9/2003
(Continued)

OTHER PUBLICATIONS

International Search Report dated Feb. 18, 2020 in PCT/JP2019/047562 filed Dec. 5, 2019, 2 pages.

*Primary Examiner* — Yu-Hsi D Sun
(74) *Attorney, Agent, or Firm* — Oblon, McClelland, Maier & Neustadt, L.L.P.

(57) ABSTRACT

An element module includes a cooler, a plurality of elements, and a conductive member. The cooler includes a first element disposition portion and a second element disposition portion which are provided on both sides in a predetermined direction. The plurality of elements are disposed in each of the first element disposition portion and the second element disposition portion. The conductive member is disposed in a space portion of the cooler. The space portion penetrates the cooler between the plurality of elements in each of the first element disposition portion and the second element disposition portion. The space portion allows the first element disposition portion and the second element disposition portion to communicate with each other. The conductive member is connected to the element of the first element disposition portion and the element of the second element disposition portion.

2 Claims, 7 Drawing Sheets

(56) References Cited

FOREIGN PATENT DOCUMENTS

| | | |
|---|---|---|
| JP | 2011-18847 A | 1/2011 |
| JP | 2018-129489 A | 8/2018 |
| JP | 2019-22293 A | 2/2019 |

\* cited by examiner

ELEMENT MODULE

TECHNICAL FIELD

The present invention relates to an element module.

BACKGROUND ART

In the related art, a cooler is disposed between two heating elements facing each other in a predetermined direction. For example, the cooler in which a pair of semiconductor elements are attached to surfaces on both sides in the predetermined direction cools each of the semiconductor elements on the surfaces on both sides by using an internally provided refrigerant.

However, in a case where a plurality of semiconductor elements disposed on the surfaces on both sides of the cooler are electrically connected, when a connection path is long, there is a possibility that electrical characteristics may be degraded.

CITATION LIST

Patent Document

[PTL 1] Japanese Unexamined Patent Application, First Publication No. 2003-258175

SUMMARY OF INVENTION

Technical Problem

An object of the present invention is to provide an element module capable of suppressing deterioration of electrical characteristics which is caused by connection of a plurality of elements disposed in a cooler.

Solution to Problem

An element module according to an embodiment includes a cooler, a plurality of elements, and a conductive member. The cooler has a first element disposition portion and a second element disposition portion which are provided on both sides in a predetermined direction. The plurality of elements are disposed in each of the first element disposition portion and the second element disposition portion. The conductive member is disposed in a space portion of the cooler. The space portion penetrates the cooler between the plurality of elements in each of the first element disposition portion and the second element disposition portion. The space portion allows the first element disposition portion and the second element disposition portion to communicate with each other. The conductive member is connected to the element of the first element disposition portion and the element of the second element disposition portion.

DESCRIPTION OF EMBODIMENTS

Hereinafter, an element module according to an embodiment will be described with reference to the drawings.

Figure 1:
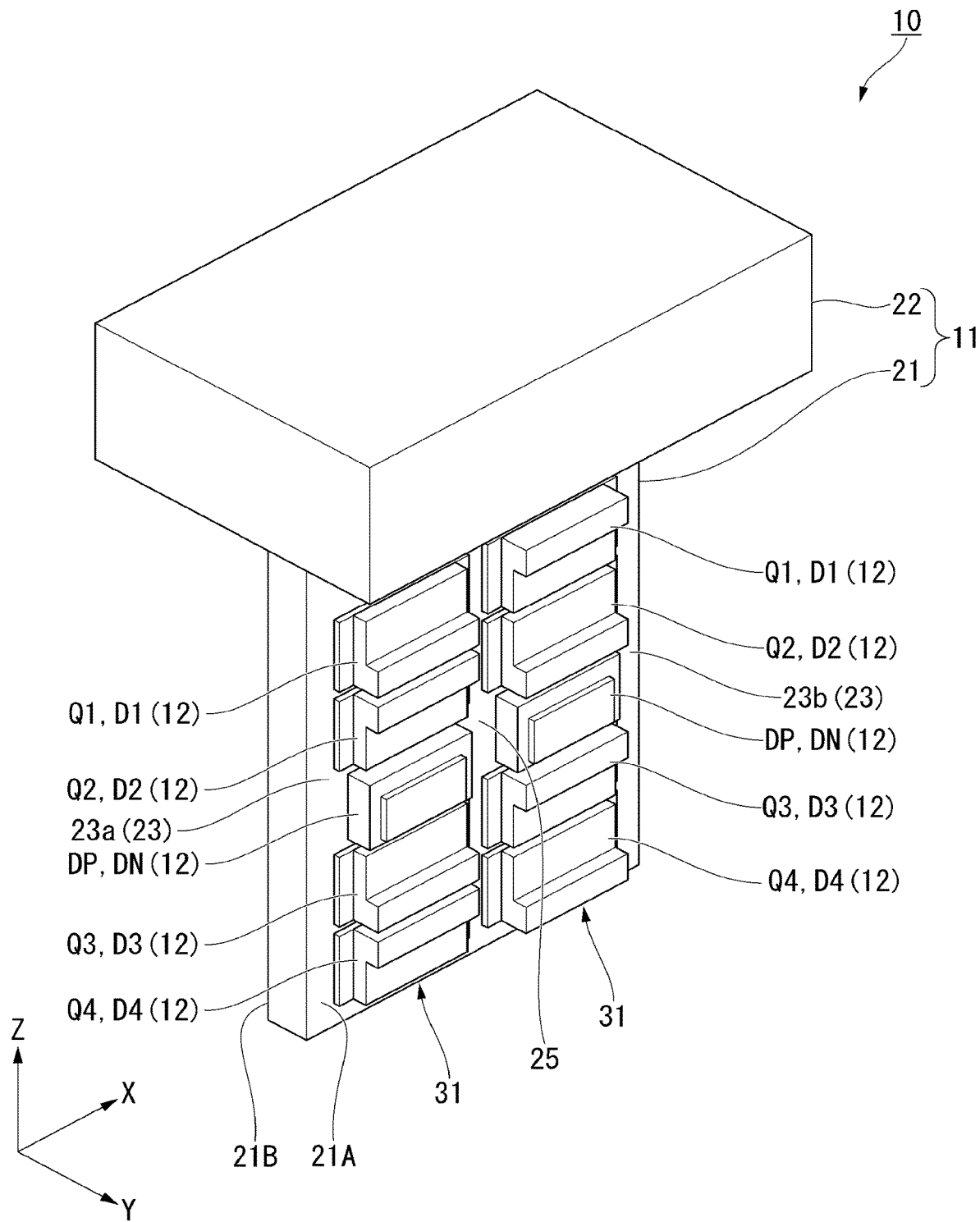
FIG. 1 is a perspective view in which a conductor plate of an element module according to an embodiment is omitted.
Figure 2:
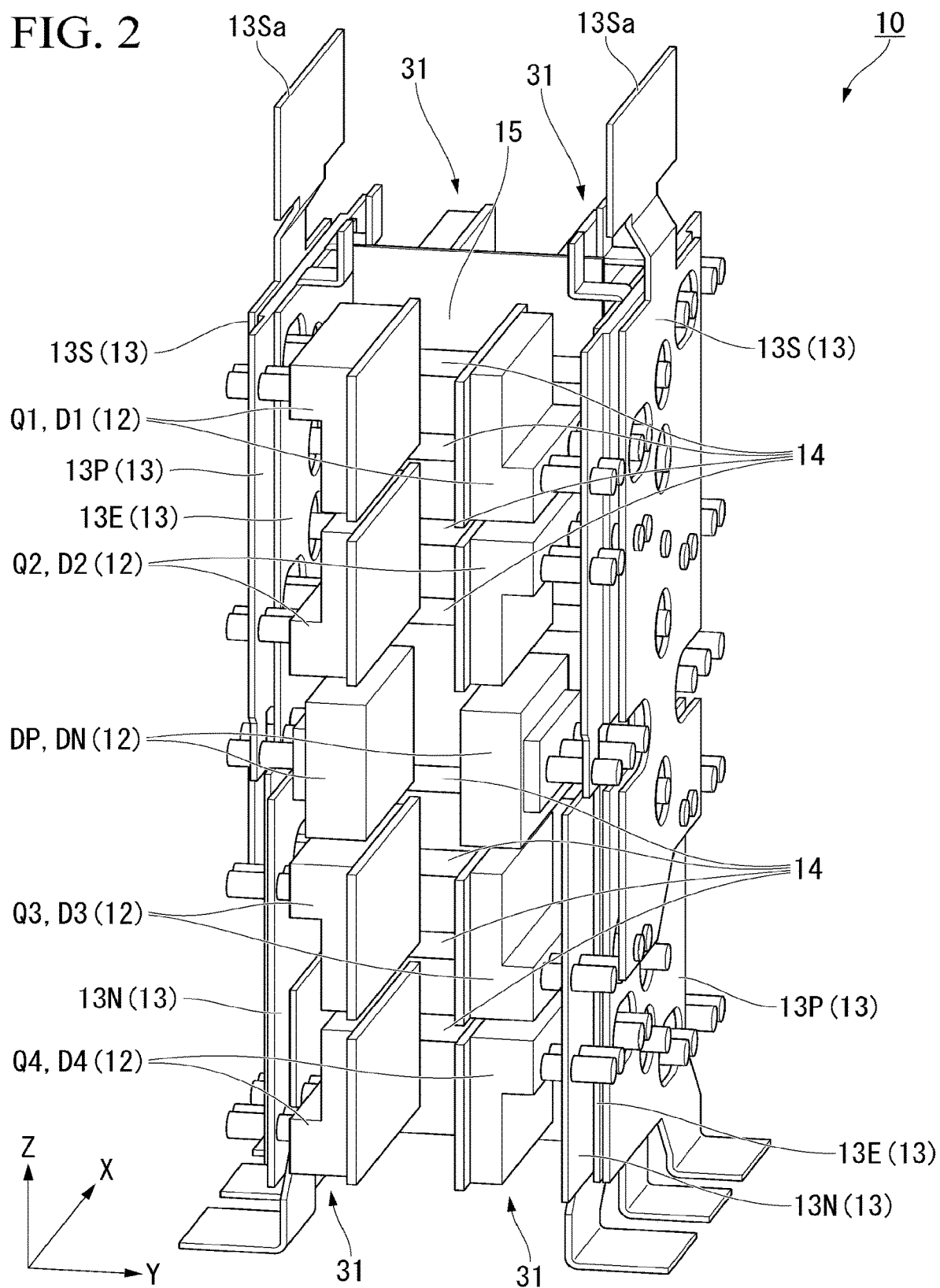
FIG. 2 is a perspective view in which a cooler of the element module according to the embodiment is omitted.
Figure 3:
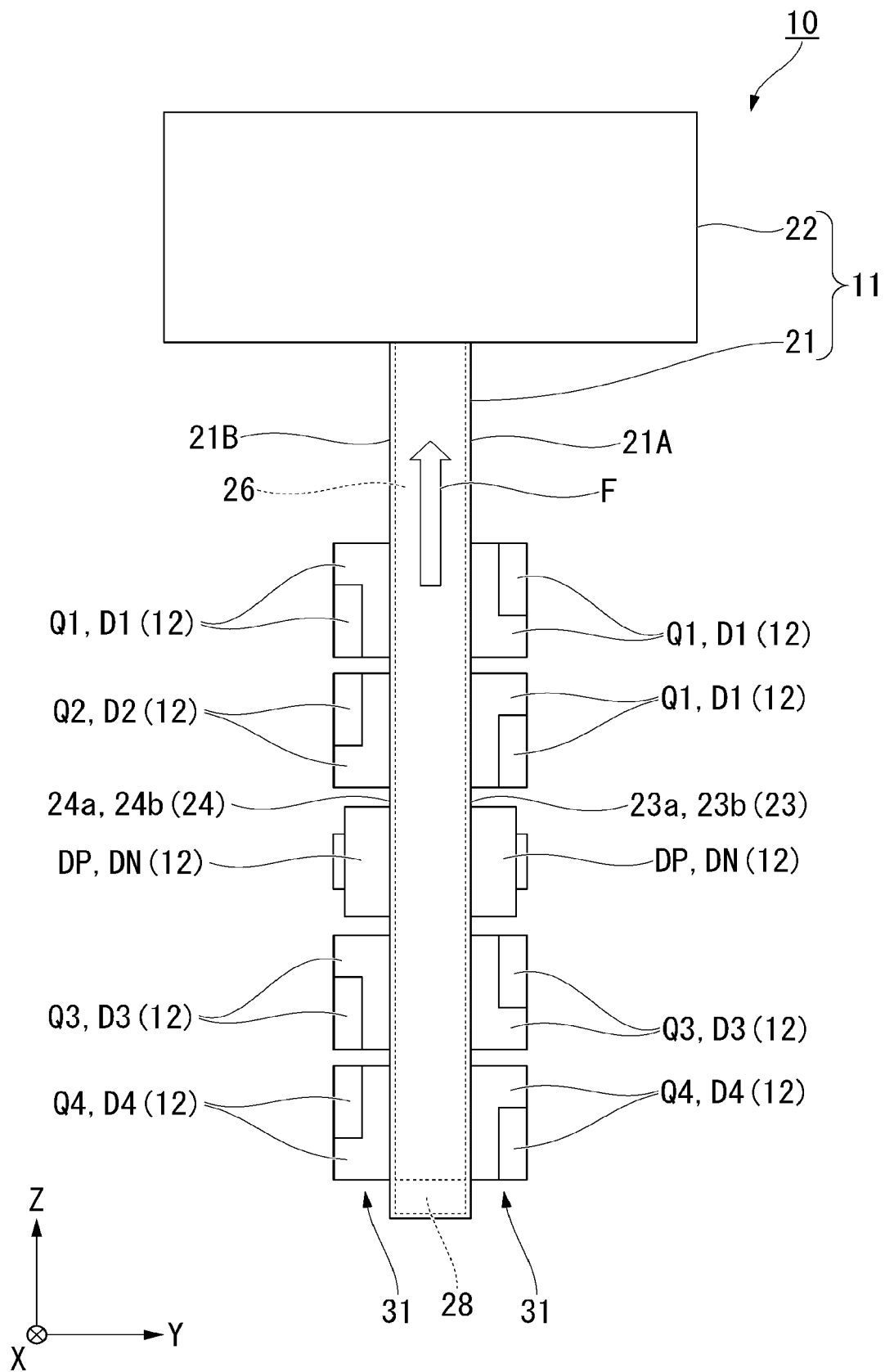
FIG. 3 is a view when viewed in an X-axis direction while the conductor plate of the element module according to the embodiment is omitted.
Figure 4:
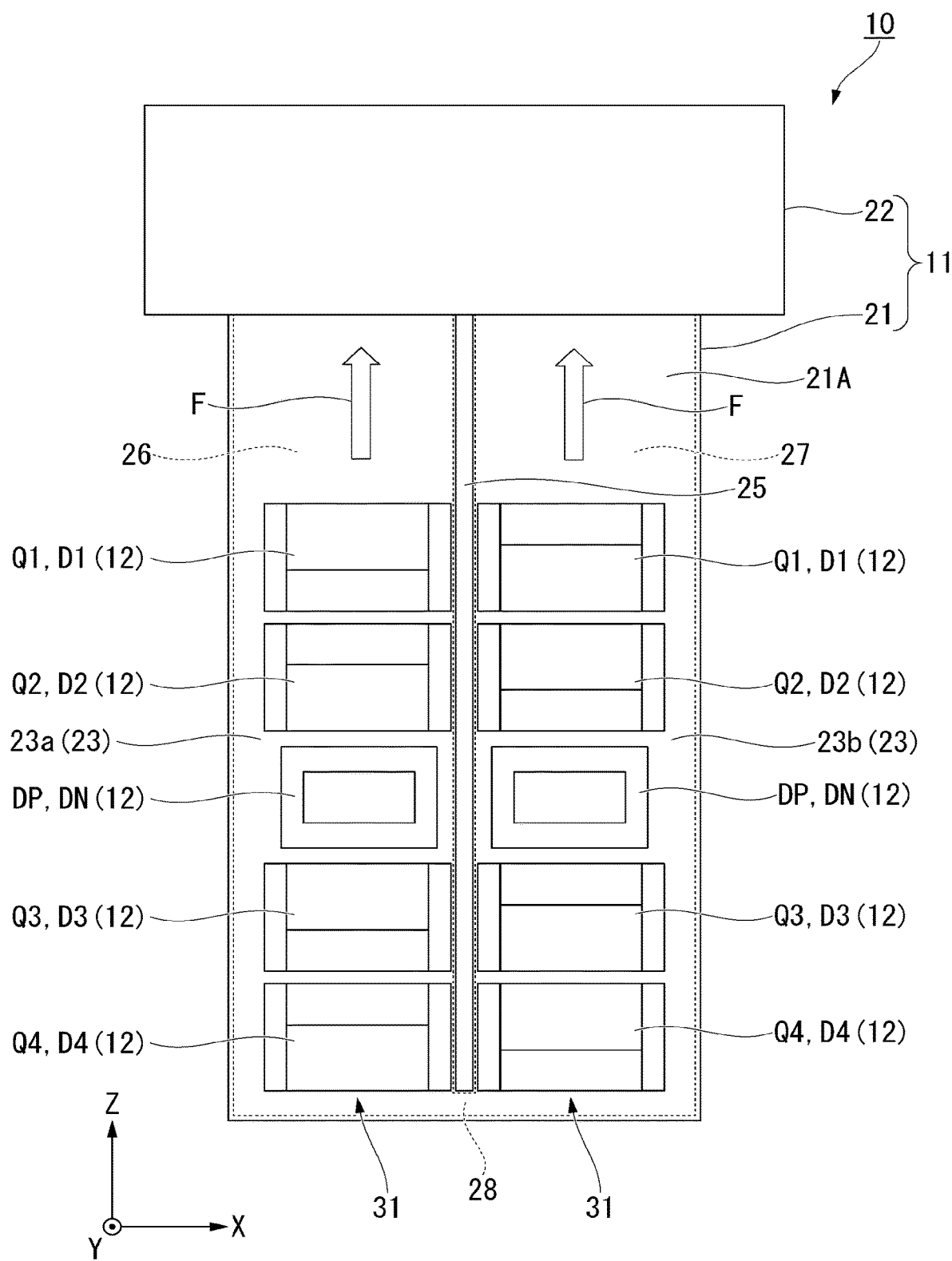
FIG. 4 is a view when viewed in a Y-axis direction while the conductor plate of the element module according to the embodiment is omitted.
Figure 5:
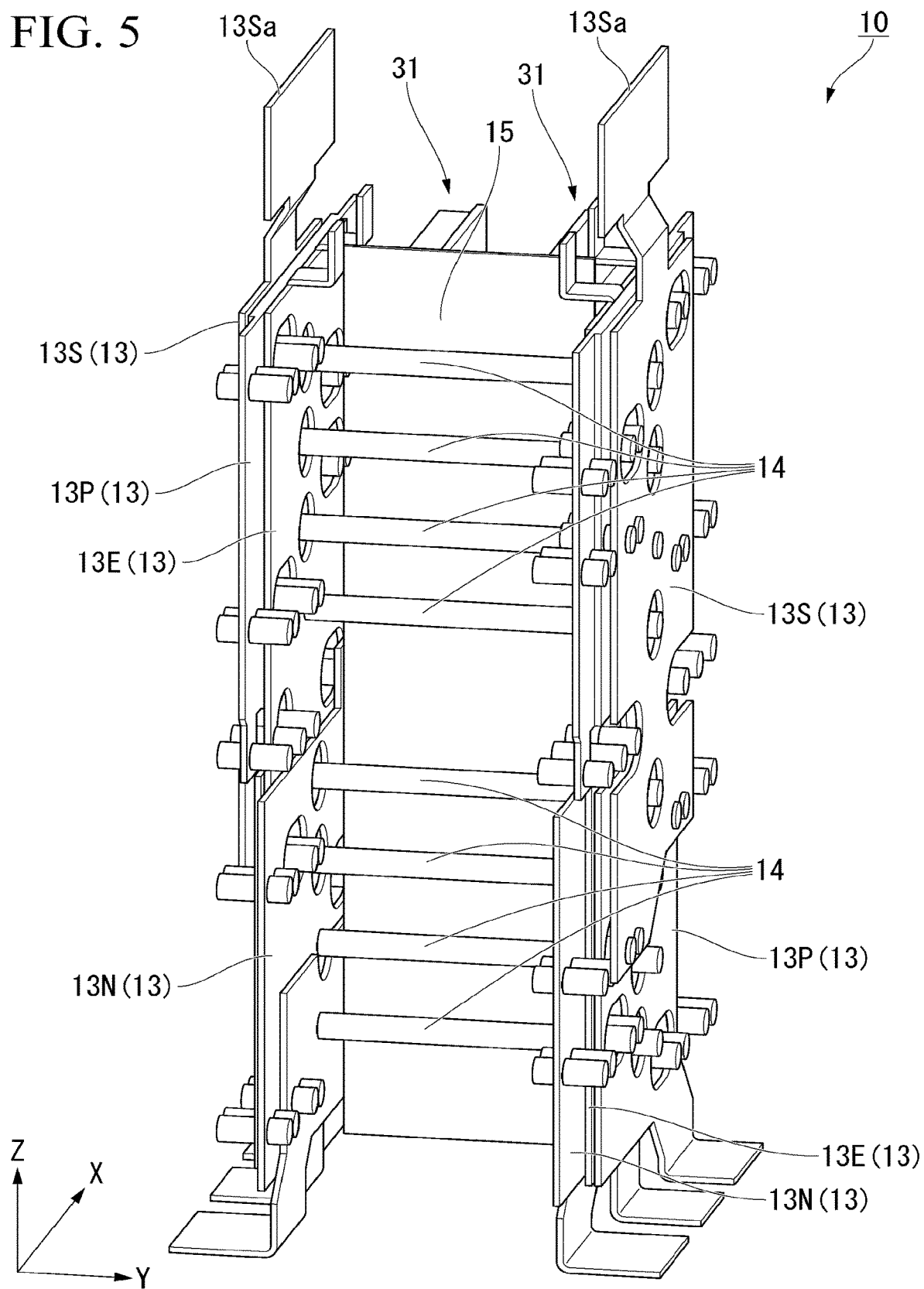
FIG. 5 is a perspective view showing the conductor plate and a conductive member of the element module according to the embodiment.
Figure 6:
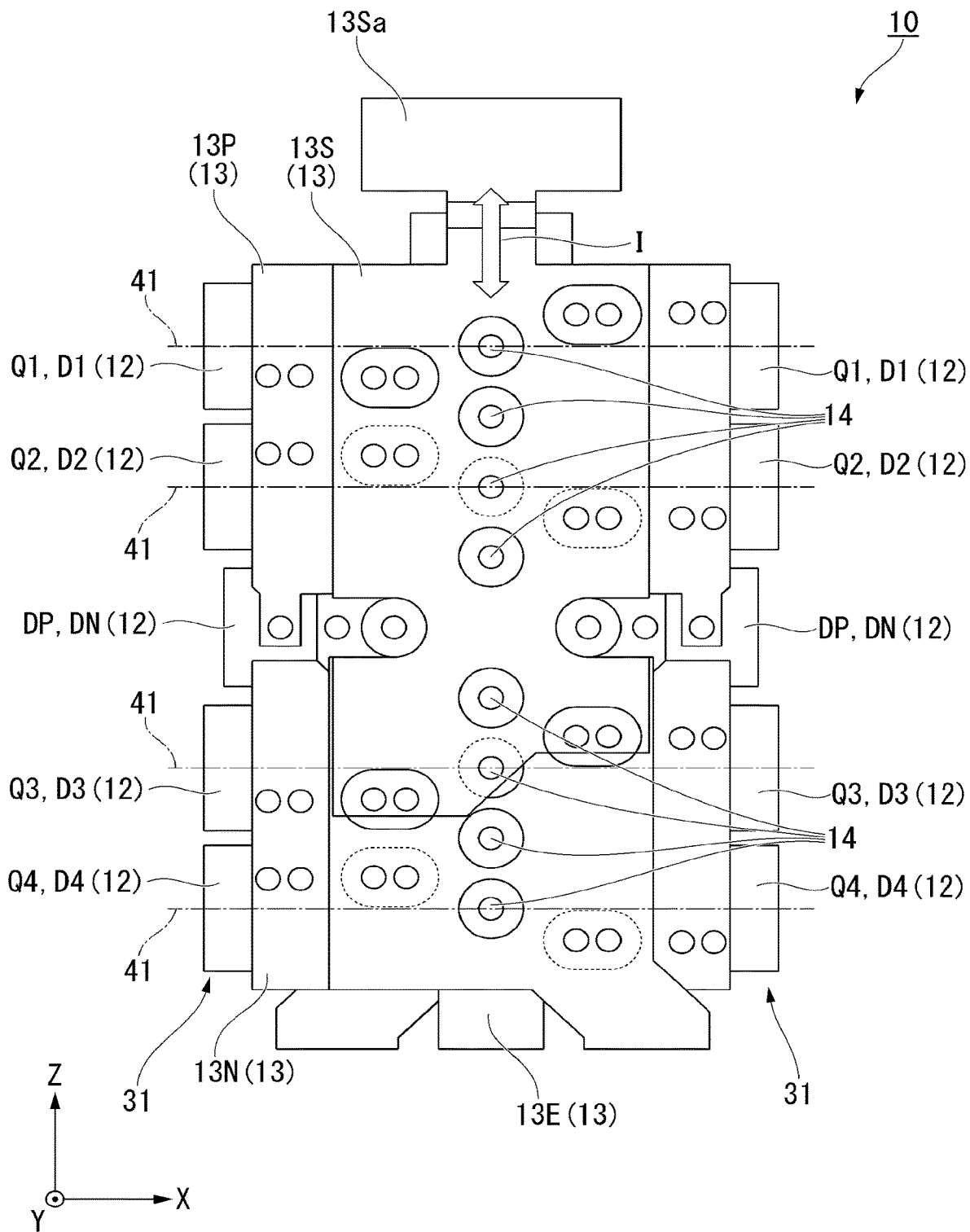
FIG. 6 is a view when viewed in the Y-axis direction while the cooler of the element module according to the embodiment is omitted.
Figure 7:
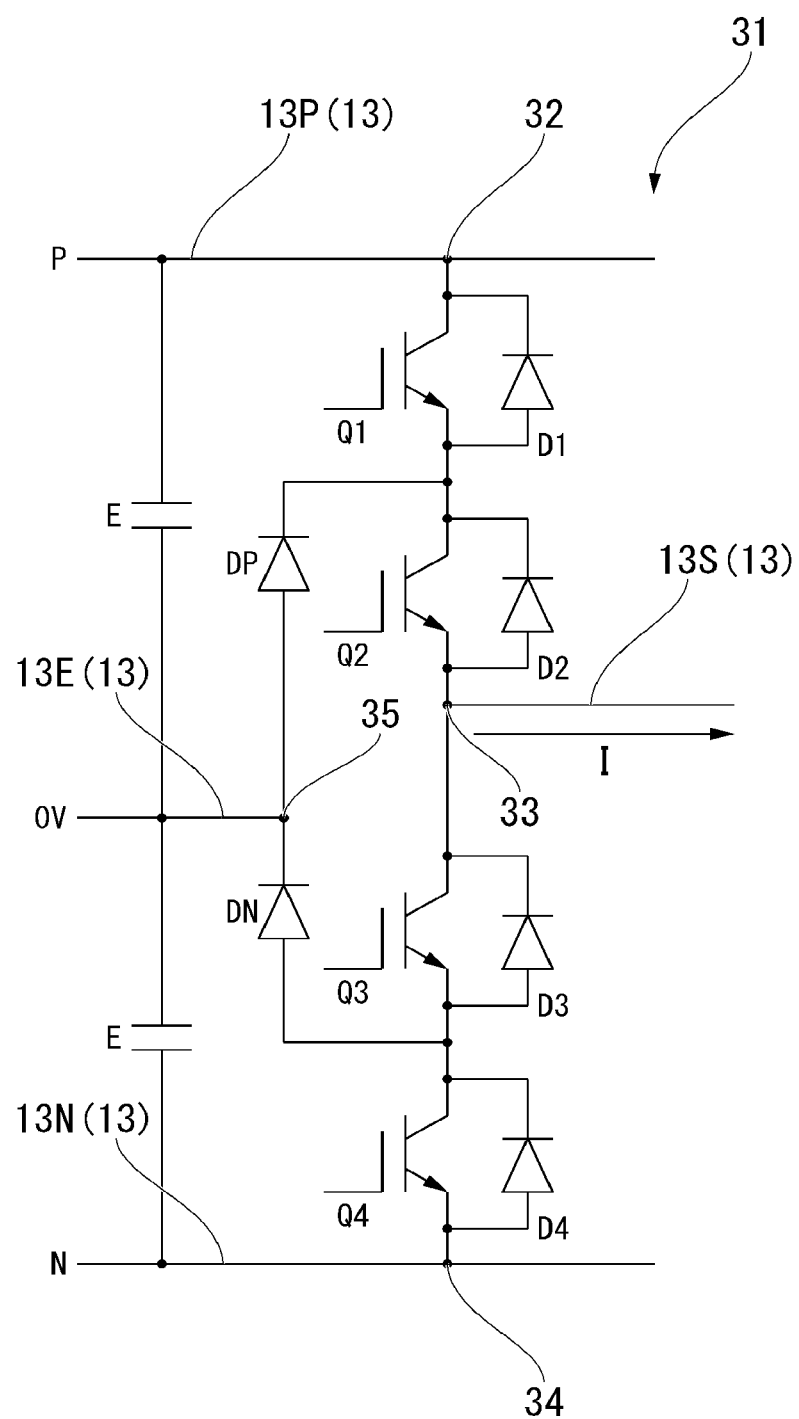
FIG. 7 is a circuit diagram of the element module according to the embodiment.

FIG. 1 is a perspective view in which a conductor plate 13 of an element module 10 according to the embodiment is omitted. FIG. 2 is a perspective view in which a cooler 11 of the element module 10 according to the embodiment is omitted. FIG. 3 is a view when viewed in an X-axis direction while the conductor plate 13 of the element module 10 according to the embodiment is omitted. FIG. 4 is a view when viewed in a Y-axis direction while the conductor plate 13 of the element module 10 according to the embodiment is omitted. FIG. 5 is a perspective view showing the conductor plate 13 and a conductive member 14 of the element module 10 according to the embodiment. FIG. 6 is a view when viewed in the Y-axis direction while the cooler 11 of the element module 10 according to the embodiment is omitted. FIG. 7 is a circuit diagram of the element module 10 according to the embodiment.

In the following, each axis direction of an X-axis, a Y-axis, and a Z-axis which are orthogonal to each other in a three-dimensional space is a direction parallel to each of the axes. For example, a forward-rearward direction of the element module 10 is parallel to the X-axis direction. A rightward-leftward direction of the element module 10 is parallel to the Y-axis direction. An upward-downward direction of the element module 10 is parallel to a Z-axis direction.

For example, the element module 10 according to the embodiment is a power module forming a power conversion unit mounted on a motor drive device.

As shown in FIGS. 1, 2, 3, 4, 5, and 6, the element module 10 according to the embodiment includes the cooler 11, a plurality of semiconductor elements 12 provided in the cooler 11, and a plurality of the conductor plates 13, a plurality of the conductive members 14, and a plurality of insulation members 15.

For example, the cooler 11 is a boiling cooler that performs evaporative cooling by using a refrigerant. The cooler 11 includes a refrigerant tank 21 for storing a liquid refrigerant and a condenser 22 connected to the refrigerant tank 21.

For example, an outer shape of the refrigerant tank 21 is a rectangular box shape. In the refrigerant tank 21, a pair of first element disposition portions 23 and second element disposition portions 24 are formed on surfaces 21A and 21B on both sides in a thickness direction (that is, the Y-axis direction).

Each of the first element disposition portion 23 and the second element disposition portion 24 is divided into two portions by a through-hole 25 penetrating a central portion of the refrigerant tank 21 in the thickness direction. Each of the two portions is a first portion 23a and a second portion 23b of the first element disposition portion 23, and a first portion 24a and a second portion 24b of the second element disposition portion 24.

An element group 31 having the same configuration including the plurality of semiconductor elements 12 (to be described later) is disposed in each of the portions 23a, 23b, 24a, and 24b. For example, four of the element groups 31 in parallel are disposed in the first portion 23a, the second portion 23b, the first portion 24a, and the second portion 24b. For example, the four element groups 31 in parallel are operated as a common converter.

For example, an outer shape of the through-hole 25 is a slit shape extending in the upward-downward direction (Z-axis direction) in the refrigerant tank 21. The refrigerant tank 21 includes a first refrigerant storage portion 26 and a second refrigerant storage portion 27, which are divided by the through-hole 25. In the first refrigerant storage portion 26, the first portion 23a of the first element disposition portion 23 and the first portion 24a of the second element disposition portion 24 are formed on surfaces on both sides in the thickness direction. In the second refrigerant storage portion 27, the second portion 23b of the first element disposition portion 23 and the second portion 24b of the second element disposition portion 24 are formed on surfaces on both sides in the thickness direction.

The refrigerant tank 21 includes a connection portion 28 that allows the first refrigerant storage portion 26 and the second refrigerant storage portion 27 to communicate with each other in a lower portion in the upward-downward direction.

The refrigerant in the refrigerant tank 21 is boiled by heat received from the plurality of semiconductor elements 12 via the first element disposition portion 23 and the second element disposition portion 24, and performs evaporative cooling on each of the semiconductor elements 12. Vapor of the refrigerant boiled in the refrigerant tank 21 flows upward in the upward-downward direction, and flows into the condenser 22. A flow direction F of the vapor of the refrigerant in the refrigerant tank 21 is a direction oriented upward from below in the upward-downward direction.

The condenser 22 is disposed in an upper portion of the refrigerant tank 21 in the upward-downward direction. For example, the condenser 22 includes a heat radiation fin (not shown). The condenser 22 is cooled by cooling air. The vapor of the refrigerant flowing from the refrigerant tank 21 into the condenser 22 is condensed by heat dissipation. The refrigerant (condensate) condensed by the condenser 22 flows downward in the upward-downward direction, and flows into the refrigerant tank 21.

For example, the plurality of semiconductor elements 12 are transistors and diodes. For example, the plurality of semiconductor elements 12 forming the element group 31 are four transistors and six diodes. The four transistors are a first transistor Q1, a second transistor Q2, a third transistor Q3, and a fourth transistor Q4. The six diodes are a first diode D1, a second diode D2, a third diode D3, a fourth diode D4, a positive electrode side diode DP and a negative electrode side diode DN.

For example, in the element group 31 of each of the portions 23a, 23b, 24a, and 24b, the first transistor Q1 and the first diode D1, and the second transistor Q2 and the second diode D2, the positive electrode side diode DP and the negative electrode side diode DN, and the third transistor Q3 and the third diode D3, and the fourth transistor Q4 and the fourth diode D4 are sequentially disposed downward from above in the upward-downward direction.

As shown in FIG. 7, each of the transistors Q1, Q2, Q3, and Q4 is a switching element such as an Insulated Gate Bipolar Transistor (IGBT). Each of the transistors Q1, Q2, Q3, and Q4 is connected to each of the diodes D1, D2, D3, and D4 which are disposed in a forward direction from an emitter to a collector between the collector and the emitter.

The collector of the first transistor Q1 is connected to a positive electrode terminal 32. The emitter of the first transistor Q1 is connected to the collector of the second transistor Q2. A connection point between the emitter of the first transistor Q1 and the collector of the second transistor Q2 is connected to a cathode of the positive electrode diode DP.

The emitter of the second transistor Q2 and the collector of the third transistor Q3 are connected to an input/output terminal 33. The emitter of the third transistor Q3 is connected to the collector of the fourth transistor Q4. A connection point between the emitter of the third transistor Q3 and the collector of the fourth transistor Q4 is connected to an anode of the negative electrode diode DN. The emitter of the fourth transistor Q4 is connected to a negative electrode terminal 34. The anode of the positive electrode diode DP and the cathode of the negative electrode diode DN are connected to a reference terminal 35.

As shown in FIGS. 2 and 6, for example, the plurality of conductor plates 13 are a positive electrode conductor plate 13P, an input/output conductor plate 13S, a negative electrode conductor plate 13N, and a reference conductor plate 13E which are provided in each of the first element disposition portion 23 side and the second element disposition portion 24 side. Each of the conductor plates 13P, 13S, 13N, and 13E is disposed parallel to an X-Z-plane in each of the first element disposition portion 23 side and the second element disposition portion 24 side. Each of the conductor plates 13P, 13S, 13N, and 13E is disposed outside in the rightward-leftward direction (Y-axis direction) with respect to the plurality of element groups 31.

A connection terminal of each of the conductor plates 13P, 13S, 13N, and 13E with an external device (not shown) is provided above or below in the upward-downward direction. A current path in each of the conductor plates 13P, 13S, 13N, and 13E is parallel to the upward-downward direction. For example, the external device connected to each of the conductor plates 13P, 13S, 13N, and 13E is an external power supply and an external motor. For example, a connection terminal 13Sa of the input/output conductor plate 13S connected to the external motor is provided above in the upward-downward direction.

As shown in FIG. 7, the positive electrode conductor plate 13P is connected to the positive electrode terminal 32 of each of the element groups 31 and a positive electrode P of an external DC power supply (not shown). The input/output conductor plate 13S is connected to an input/output terminal 33 for inputting and outputting an alternating current (AC) I of each of the element groups 31 and an external motor (not shown). The negative electrode conductor plate 13N is connected to the negative electrode terminal 34 of each of the element groups 31 and a negative electrode N of an external DC power supply (not shown). The reference conductor plate 13E is connected to the reference terminal 35 of each of the element groups 31 and a reference potential point of an external DC power supply (not shown). For example, the reference potential point is a potential point of zero V.

As shown in FIGS. 2 and 5, for example, an outer shape of each of the plurality of conductive members 14 is a rod shape. The plurality of conductive members 14 are disposed in the through-hole 25. The plurality of conductive members 14 connect the connection points, the terminals, the semiconductor elements 12 which are the same as each other in the two element groups 31 of the first element disposition portion 23 and the two element groups 31 of the second element disposition portion 24 in an equipotential manner. For example, the same terminals are the positive electrode terminal 32, the input/output terminal 33, the negative electrode terminal 34, and the reference terminal 35.

For example, the plurality of insulation members 15 are two insulation sheets. The two insulation members 15 are disposed in the through-hole 25. The two insulation members 15 pinch the plurality of conductive members 14 from both sides in the forward-rearward direction (X-axis direction) inside the through-hole 25. The first insulation member 15 is disposed between the element group 31 of each of the first portions 23a and 24a of the first element disposition portion 23 and the second element disposition portion 24 and the plurality of conductive members 14. The second insulation member 15 is disposed between the element group 31 of each of the second portions 23b and 24b of the first element disposition portion 23 and the second element disposition portion 24 and the plurality of conductive members 14. The insulation member 15 may not be provided in an insulated state when a sufficiently empty gap is formed between the through-hole 25 and the conductive member 14.

As shown in FIG. 6, the element module 10 includes a plurality of gate lines 41 connected to gates of the transistors Q1, Q2, Q3, and Q4. The plurality of gate lines 41 are disposed to be orthogonal to the current path in each of the conductor plates 13P, 13S, 13N, and 13E around at least the element module 10, and to be parallel to the forward-rearward direction.

According to the above-described embodiment, the plurality of conductive members 14 disposed in the through-hole 25 of the refrigerant tank 21 are provided. In this manner, it is possible to suppress deterioration in electrical characteristics which is caused by connection between the plurality of element groups 31 of the first element disposition portion 23 and the plurality of element groups 31 of the second element disposition portion 24. For example, compared to a case where the plurality of conductive members 14 disposed in the through-holes 25 are not provided, it is possible to prevent a current path from being lengthened due to a roundabout route of the refrigerant tank 21 when the plurality of element groups 31 disposed on the surfaces 21A and 21B on both sides of the refrigerant tank 21 are to be connected.

The plurality of conductive members 14 are disposed in the through-hole 25 between the element groups 31 of each of the first portions 23a and 24a and the element groups 31 of each of the second portions 23b and 24b. In this manner, it is possible to suppress a possibility that a flow of the refrigerant may be hindered inside each of the first refrigerant storage portion 26 and the second refrigerant storage portions 27. The outer shape of the through-hole 25 has a slit shape extending in the flow direction F (that is, the upward-downward direction) of the vapor of the refrigerant in the refrigerant tank 21. In this manner, it is possible to suppress a possibility that the flow of the refrigerant may be hindered.

The plurality of conductive members 14 disposed in one through-hole 25 are provided. In this manner, for example, compared to a case where the plurality of conductive members 14 disposed in each of the plurality of through-holes 25 are provided, it is possible to suppress a possibility that temperatures of the conductive member 14 and a peripheral portion may rise due to heat generation of each of the conductive members 14.

The refrigerant tank 21 has the connection portion 28 that allows the first refrigerant storage portion 26 and the second refrigerant storage portion 27 to communicate with each other in the lower portion in the upward-downward direction. In this manner, it is possible to suppress a possibility that the refrigerant may unevenly be distributed inside the refrigerant tank 21.

The plurality of gate lines 41 orthogonal to the current path in each of the conductor plates 13P, 13S, 13N, and 13E are provided. In this manner, current imbalance can be reduced by reducing the influence of a magnetic field.

Hereinafter, a modification example will be described.

In the above-described embodiment, the cooler 11 is not limited to the boiling cooler, and may be other coolers. For example, other coolers may be a cold plate that performs cooling by using an internally flowing low-temperature refrigerant.

In the above-described embodiment, the number of the through-holes 25 in the refrigerant tank 21 is not limited to one, and a plurality of the through-holes 25 may be formed in the refrigerant tank 21.

In the above-described embodiment, the plurality of element groups 31 disposed on the surfaces 21A and 21B on both sides of the refrigerant tank 21 are not limited to a configuration of four groups in parallel, and for example, a configuration may be adopted so that multiple groups of more than four may be disposed in parallel.

In the above-described embodiment, the element group 31 includes the four transistors and the six diodes. However, the present invention is not limited thereto, and an appropriate number and type of semiconductor elements 12 may be provided.

According to at least one embodiment described above, the plurality of conductive members 14 disposed in the through-hole 25 of the refrigerant tank 21 are provided. In this manner, it is possible to suppress deterioration in the electrical characteristics which is caused by the connection between the plurality of element groups 31 of the first element disposition portion 23 and the plurality of element groups 31 of the second element disposition portion 24.

Some embodiments of the present invention have been described. However, the embodiments have been described as examples, and do not intend to limit the scope of the invention. The embodiments can be implemented in various other forms, and various omissions, substitutions, and modifications can be made within the scope not departing from the concept of the invention. The embodiments or modifications thereof are included within the scope and the concept of the invention, and are also included within the scope of the invention described in the appended claims and an equivalent scope thereof.

REFERENCE SIGNS LIST

10: Element module
11: Cooler
12: Semiconductor element
13: Conductor plate
14: Conductive member
15: Insulation member
21: Refrigerant tank
22: Condenser
23: First element disposition portion
24: Second element disposition portion 25: Through-hole
26: First refrigerant storage portion
27: Second refrigerant storage portion
28: Connection portion
31: Element group

What is claimed is:

1. An element module, comprising:
a cooler including a first element disposition portion and a second element disposition portion which are provided on both sides in a predetermined direction, and including at least one refrigerant storage portion configured to internally store a refrigerant between the first element disposition portion and the second element disposition portion;
a plurality of elements disposed in each of the first element disposition portion and the second element disposition portion, and including transistors;
a conductive member disposed in a space portion through which the first element disposition portion and the second element disposition portion are allowed to communicate with each other by penetrating the cooler between the plurality of elements in each of the first element disposition portion and the second element disposition portion, and connected to the element of the first element disposition portion and the element of the second element disposition portion;
a plurality of conductor plates disposed on a side opposite to each facing side of the first element disposition portion and the second element disposition portion, and to which the plurality of elements are connected; and
a plurality of gate lines connected to a gate of each of the transistors,
wherein the space portion is formed in a long slit shape along a flow direction of the refrigerant in the refrigerant storage portion,
each of the first element disposition portion and the second element disposition portion is divided into two portions on both sides in a direction orthogonal to the flow direction of the refrigerant across the space portion, and thereby, the refrigerant storage portion has two of refrigerant storage portions,
each of the transistors is disposed in line along the flow direction of the refrigerant in each divided portion of the first element disposition portion and the second element disposition portion, and
the plurality of gate lines intersect with a current path in each of the conductor plates.

2. The element module according to claim 1,
wherein the cooler includes a connection portion through which internal communication is allowed in end portions of two of refrigerant storage portions.

* * * * *